United States Patent
Huang et al.

(10) Patent No.: US 6,549,862 B1
(45) Date of Patent: Apr. 15, 2003

(54) VECTOR NETWORK ANALYZER ARCHITECTURE BASED ON SLIDING CORRELATOR TECHNIQUES

(75) Inventors: Chia-Chi Huang, Hsin-Shu (TW); Yuh-Maiw Jong, Taoyuan (TW); Jian-Hui Shen, Hsin-Chu (TW)

(73) Assignee: National Science Council, Taipei (CN)

( * ) Notice: Subject to any disclaimer, the term of this patent is extended or adjusted under 35 U.S.C. 154(b) by 0 days.

(21) Appl. No.: 09/386,263

(22) Filed: Aug. 31, 1999

(30) Foreign Application Priority Data

Dec. 28, 1998 (TW) ........................................ 87121699 A

(51) Int. Cl.$^7$ .............................................. G01R 23/00

(52) U.S. Cl. ........................................ 702/77; 702/110

(58) Field of Search ................................ 702/57–59, 66, 702/75–72, 106–112, 117–118, 121–122, 124, 126, 183, 185, 189; 324/76.37, 76.19, 76.21, 76.23; 375/130, 145, 150, 344; 343/703; 342/165, 172, 189, 192; 455/67.3, 67.4, 155, 205, 226.1

(56) References Cited

U.S. PATENT DOCUMENTS

| | | | | |
|---|---|---|---|---|
| 4,067,060 A | * | 1/1978 | Poussart et al. | 324/76.21 |
| 4,703,433 A | * | 10/1987 | Sharrit | 364/485 |
| 5,832,026 A | * | 11/1998 | Li | 375/202 |
| 5,841,808 A | * | 11/1998 | Rizzo et al. | 375/208 |
| 5,950,124 A | * | 9/1999 | Trompower et al. | 455/422 |
| 6,144,692 A | * | 11/2000 | Beck | 343/703 |
| 6,236,371 B1 | * | 5/2001 | Beck | 343/703 |

OTHER PUBLICATIONS

Bultitude, Robert J.C., et al., A Comparison of Indoor Radio Propagation Characteristics at 910 MHz and 1.75 GHz, IEEE Journal on Selected AReas in Communications, vol. 7, No. 1, Jan. 1999, pp. 20–30.

Wireless Information Networks, Section 5.2 Time–Domain Measurement Techniques, John Wile & Sons, Inc., 1995, pp. 114–120.

* cited by examiner

Primary Examiner—Marc S. Hoff
Assistant Examiner—Craig Miller
(74) Attorney, Agent, or Firm—Workman, Nydegger & Seeley

(57) ABSTRACT

A vector network analyzer using sliding correlator techniques and multi-user detection techniques. The sliding correlator technique is based on the time domain sliding effect caused by a small clock frequency offset in the pseudo random code generators of a transmitter and a receiver. A time scaled version of the impulse response of the device under test can be obtained from the time domain slided pseudo random code signals by using a correlator. A multi-user detection method is introduced using two uncorrelated pseudo random codes. One of the uncorrelated pseudo random codes measures the D.U.T. and another code is a reference channel. These codes can be demodulated and despread with one receiver module. A Fast Fourier Transform of the measured impulse response is the frequency response of the measured signal. By using multi-user techniques and calculating the frequency domain despreaded test signal and the frequency domain despreaded reference signal repeatedly, the test device frequency responses is obtained and disturbances of resulting signals caused by the receiver chaining characteristics and multi-user PN code effects are eliminated. The measurement time is also reduced as a single measurement generates output data for a wide frequency band instead of for a single frequency.

13 Claims, 6 Drawing Sheets

VECTOR NETWORK ANALYZER ARCHITECTURE BASED ON SLIDING CORRELATOR TECHNIQUES

FIELD OF THE INVENTION

Sliding correlator techniques for spreading spectrum communication systems are employed to design a vector network analyzer. Cost and complexity of both the signal source and the receiver is much reduced. The measuring time can also be reduced and thus increases the efficiency of network measurements.

BACKGROUND OF THE INVENTION

A vector network analyzer is an important instrument for measuring and characterizing RF or microwave devices and components. Most network analyzers currently sold on the markets adopt a super-heterodyne receiver architecture for measurements. Some calibration laboratory might use a six-port network analyzer in order to achieve measurement results with higher accuracy, nevertheless at the expense of much higher system complexity and cost. Another way to conduct network analysis is to use very high speed pulses and conduct measurements in time domain. But this method is still under development in some research laboratories.

Almost all the network analyzers currently sold on the markets adopt the super-heterodyne receiver architecture. FIG. 1 shows the example based on HP-8510 vector network analyzer. The analyzer uses two intermediate frequencies and four demodulation channels to detect the amplitude and the phase of the signal. This method requires signal source with high accuracy as well as a wide band scanning synthesizer, which increases the cost. In addition, frequency of the signal source should be able to vary either continuously or with very small increment in order to obtain continuous information in frequency domain. Measuring time can be very long when the target network is wide band in nature or when high resolution is required.

DESCRIPTION OF THE PRIOR ART

References to the application of sliding correlators are: R. J. C. Bultitude etc., in IEEE J. Selected Areas Cmmun., Vol. SAC-7 (I) p20–30 (1989) and Kaveh Pahlavan etc., in Wireless Information Networks, p114–120, John Wiley & Sons, inc. (1995).

The receiver architecture in the present invention is designed for spread spectrum communication, which is very different from the super-heterodyne receiver architecture widely used in the commercial vector network analyzer. Unlike the vector network analyzer based on the super-heterodyne architecture which uses narrow-band signal source, wide-band signal is introduced as the source in the present invention so that wide-band frequency response from the device under test can be gathered.

The present invention introduces the sliding correlator techniques which is commonly employed in spread spectrum communication systems. A sliding correlator technique is based on the time domain sliding effect caused by a small clock frequency offset in the pseudo random code generators of a transmitter and a receiver. A time scaled version of the impulse response of the device under test can be obtained from the time domain slided pseudo random code signals by a correlator. On the other hand, vector network analyzers based on the super-heterodyne receiver architecture uses the super-heterodyne technique to demodulate the transmitted signals. The high frequency signal feeding the device is down-converted to intermediate frequency region at the receiver so that the narrow-band response from the device under test can be demodulated. As a result, the information of each measurement in the present invention is much larger than the vector network analyzers based on the super-heterodyne receiver architecture.

The present invention uses only a synthesizer for frequency hopping unlike the continuous frequency scanning instrument in the super-heterodyne receiver architecture. For the same bandwidth, measurements can be done with several frequency hopping in the present invention instead of continuous frequency scan within the bandwidth. Therefore, the receiver in the present invention shows more simplicity.

SUMMARY OF THE INVENTION

This invention relates to a novel architecture of vector network analyzers for measuring and characterizing RF or microwave devices and components. Sliding correlator techniques are used in the design of vector network analyzers.

The target device is tested in the time domain, then the time domain response is converted into frequency domain by fast Fourier transform.

This invention also relates to a method for network measurements by these vector network analyzers.

REFERENCE NUMBER OF THE ATTACHED DRAWINGS

Figure 1:
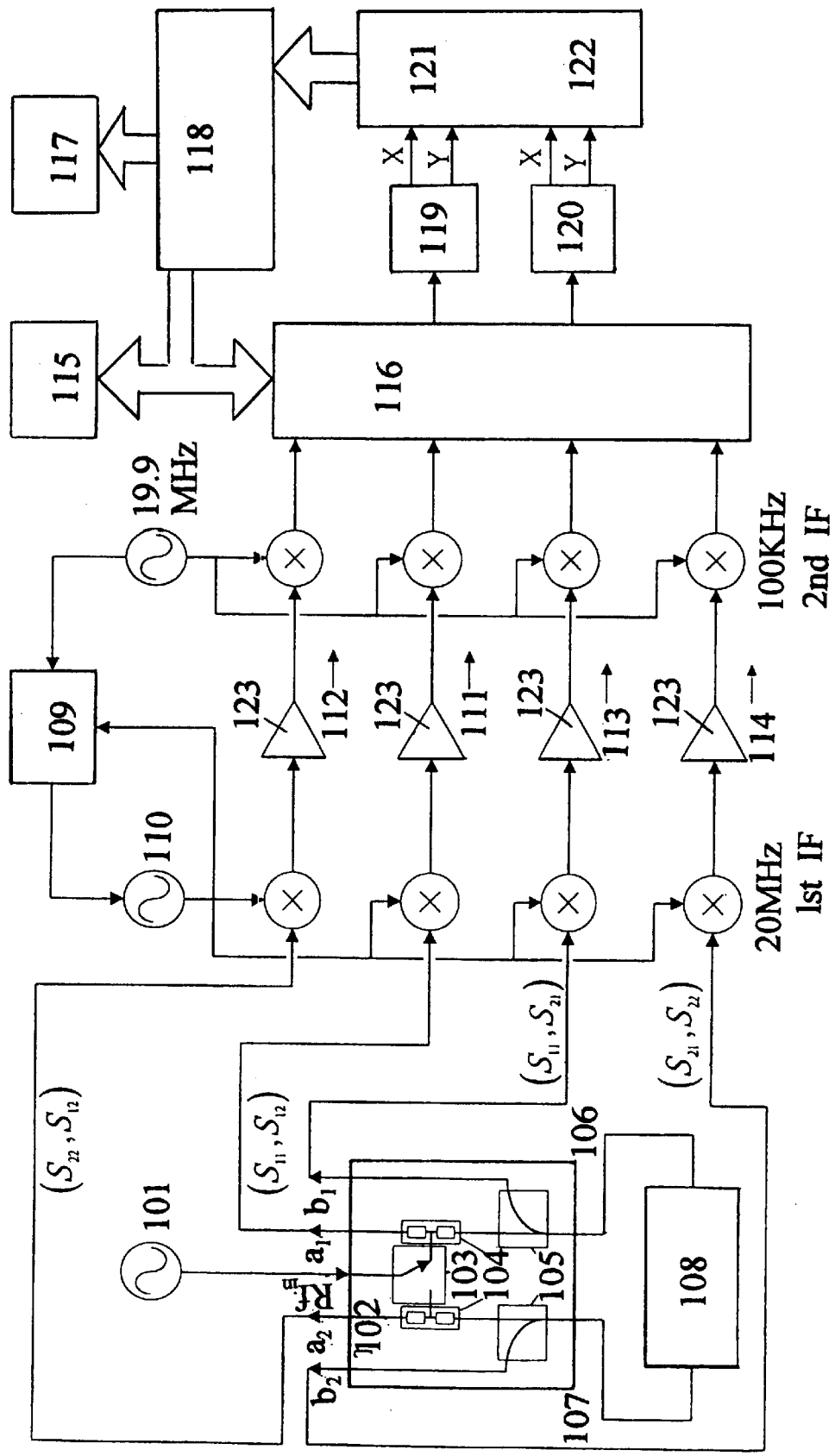
FIG. 1 illustrated HP-8510 vector network analyzer.

101 . . . RF Source
102 . . . Test Set
103 . . . RF switch
104 . . . power splitter
105 . . . bridge
106 . . . port 1
107 . . . port 2
108 . . . Device Under Test
109 . . . Phase Lock
110 . . . Harmanic Generator
111 . . . Reference Channel 1
112 . . . Reference Channel 2
113 . . . Test Channel 1
114 . . . Test Channel 2
115 . . . Panel Control
117 . . . Display
116 . . . IF amp and input selector
118 . . . Computer Processing and Error Correction
119 . . . Reference Detector
120 . . . Test Detector
121 . . . Sample and hold
122 . . . A/D Convertor 123 . . . Amp
201 . . . Programmable PN Code Generator
202 . . . reference
203 . . . PN Chip Rate
204 . . . Synthesizer
205 . . . Reference Signal
206 . . . Reflection (Transmission)
207 . . . Transmission(Reflection
208 . . . IQ demodulator Signal)
209 . . . Reference Channel
213 . . . BPF
214 . . . LPF
215 . . . IQ Demodulator
301 . . . Programmable PN Code Generator
302 . . . network
303 . . . LPF
304 . . . digital signal processing software

DETAIL DESCRIPTION OF THE INVENTION

Figure 2:
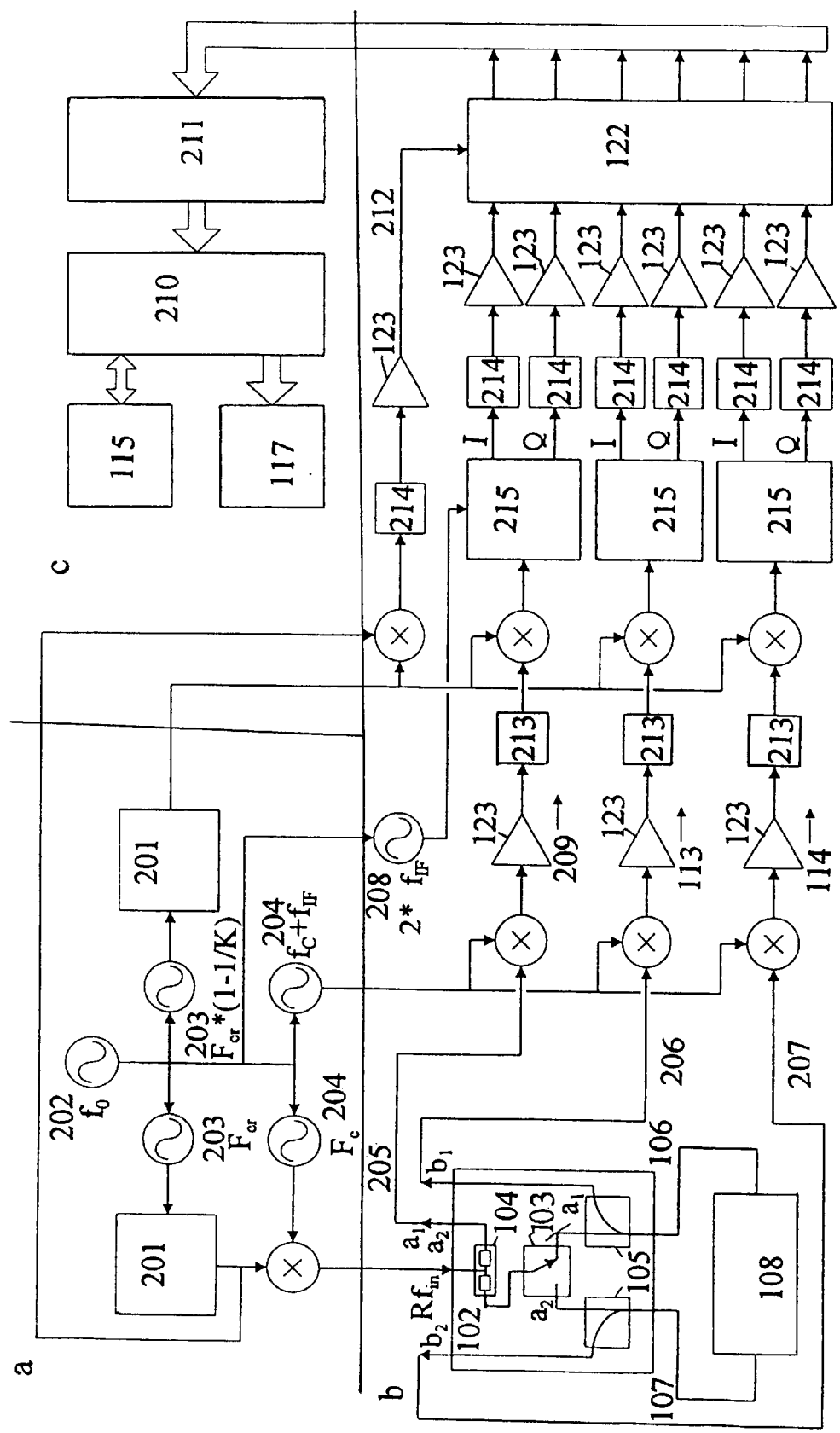
FIG. 2 illustrated vector network analyzer using sliding correlator architecture:
(a area) signal source
(b area) receiver
(c area) digital signal processor.

This invention relates to a novel vector network analyzer architecture for measuring and characterizing RF or microwave devices and components. The vector network analyzer architecture in the present invention is shown in FIG. 2, which comprises a signal source, a receiver, and a signal processing software.

In signal source (a), there are Programmable PN Code Generator (201), signal generator, modulator, and Synthesizer (204). Two sets of Synthesizers (204) are interconnected as well as Reference (202) and two sets of Programmable PN Code Generator (201) are interconnected so that signal can be transferred to LPF (214) or Test Set (102).

Programmable PN Code Generator controls the chip rate of the output PN code sequence with frequency generated by the synthesizer. A high frequency synthesizer (frequency mixer) then modulates the output PN code sequence to the desired frequency band.

Receiver (b) comprises portions other than the signal source block and the signal processing software block, in which RF switch (103) and Bridge (105) control directions of the signal so that the S parameter in both directions can be measured by switching RF switch (103) instead of varying the configuration between the device under test and the vector network analyzer.

Sliding correlator techniques for the spread spectrum communication system are employed in the present invention to design a vector network analyzer. This technique uses the minor difference between the PN code sequence chip rate generated by the signal source and the one generated by the receiver to achieve the sliding effect between the PN code sequences from the signal source and from the receiver. Due to this sliding effect, the present invention can obtain the impulse response from the network under test in the time domain. The response in the frequency domain can then be obtained by Fast Fourier Transform (211).

Cost and complexity of both the signal source and the receiver is much reduced for the network analyzer using the architecture in the present invention. Because information within a bandwidth can be obtained in a single measurement, the measuring time can also be reduced and thus increases the efficiency of network measurements.

FIG. 2 shows a method using the sliding correlator technique for the spread spectrum communication to probe the network under test. This architecture can gather information as much as the bandwidth set by the chip rate of the PN code sequence in a single measurement. Therefore, frequency response in a frequency band can be obtained with the programmable PN code generator in a single measurement. Comparing to the network analyzer using the super-heterodyne receiver architecture, the efficiency of network measurements is dramatically increased. In addition, another advantage of the present invention is that frequency of the signal source needs not to be varied either continuously or with very tiny increment. When testing wide band network, the bandwidth is divided into n segments in the present invention and the bandwidth of each segment can be covered in a single measurement. Hence, the synthesizer generating source signal needs only n hops for the measurement within the whole bandwidth. The cost and the complexity of the synthesizer can be significantly reduced.

Because PN code sequence for the spread spectrum communication system is used as signal source in the present invention, the correlation between different PN code sequences is very low in nature so that signals from various users in a code division multiple access (CDMA) communication system can be identified. This feature can be used in vector network analyzers to reduce the complexity of the receiver as well as the channel numbers so that errors can be reduced.

Two different programmable PN code generators are used to generate reference signal and testing signal as signal sources. After being modulated to the desired frequency band, the PN code sequence one used as testing signal passes through the device under test. The output signal and the PN code sequence two used as the reference signal are combined and passed to a receiver for demodulation. During the demodulation process, single channel is used to demodulate the signals to the baseband frequency. Then a sliding correlator is used to demodulate the two signals by two corresponding PN code sequences in the IQ channels. Both the demodulated reference signal and the demodulated testing signal are obtained. Post processes such as A/D conversion, fast Fourier transform, digital signal processing, and result displaying are similar to the processes mentioned later.

The present invention uses different channels to identify reflection and transmission signals from different directions, only two channels at most are necessary for demodulation for the architecture in the present invention. The measuring time is hence reduced.

It is known that device characteristics can't be the same in high frequency or microwave region even for two identical devices. Consequently, it's hard to obtain the same characteristics among the three receiver channels mentioned in the previous section. Manufacturing costs of the vector network analyzer will be high if we need a much balanced characteristics among channels. If the characteristics among channels is not balanced, errors can become unavoidable. This balancing problem among channels can be removed if only one channel is used for demodulation by using various PN code sequences with trivial correlation. The accuracy is enhanced due to the reduced channel number.

In the present invention, though the reflection signal and the transmission signal are processed in two channels, balancing can be ignored because each channel has the ability to demodulate the reference signal and the reflection signal (or the transmission signal). $S_{11}$ or $S_{22}$ can be obtained from the fast Fourier transform of both the demodulated reflection signal and the demodulated reference signal without channel error. Similarly, $S_{21}$ or $S_{21}$ can be obtained for the demodulated transmission signal. Because channel errors are both removed so that the demodulation accuracy is not affected by the balancing problem. The present invention can also demodulate the reflection signal and the transmission signal with only one channel. In this architecture, a RF switch is used to control signal directions. However, the measuring time is also increased.

Figure 6:
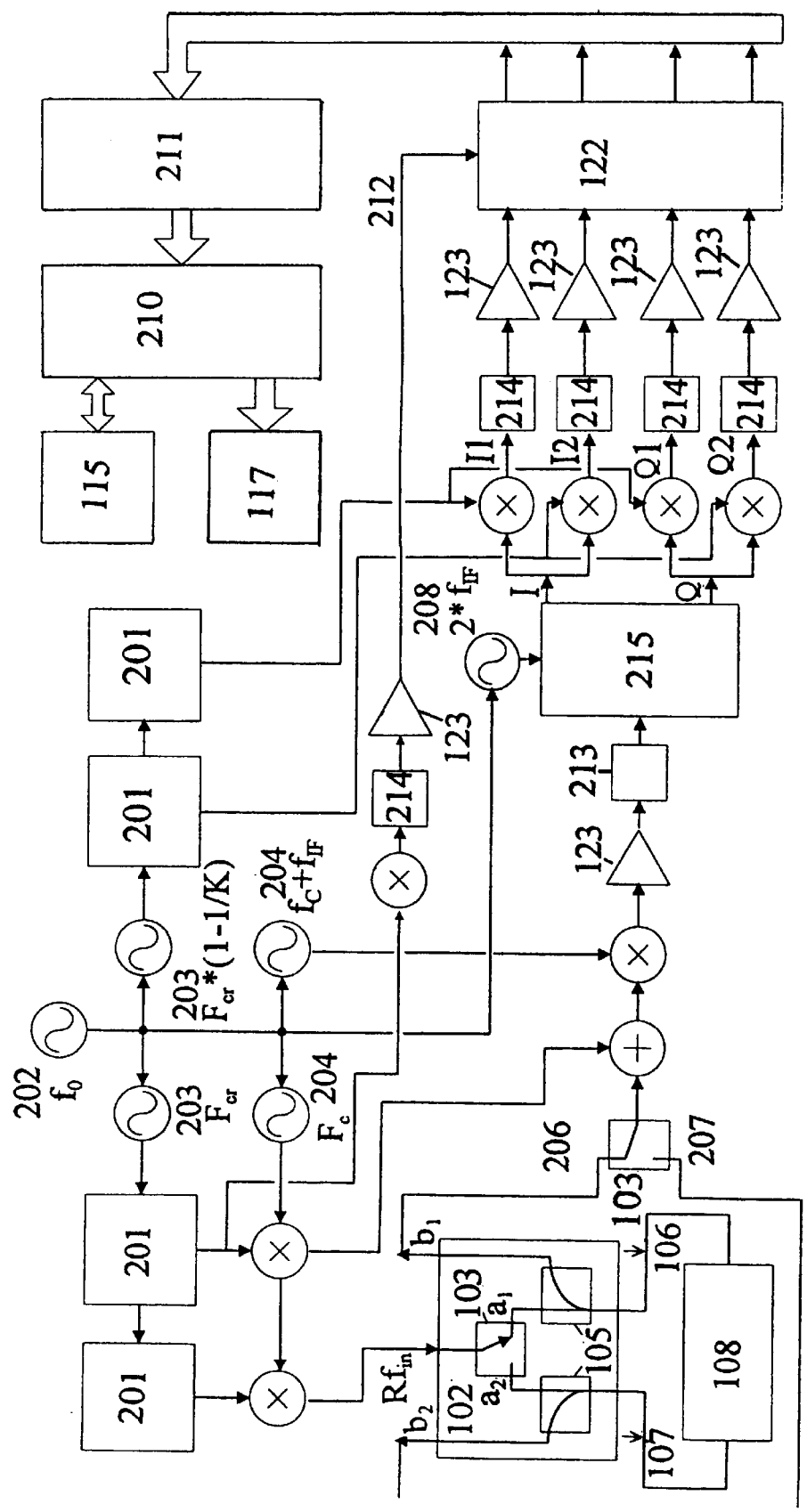
FIG. 6 illustrated Block diagrams of another architecture.

FIG. 6 shows the block diagram of another embodiment, in which the three channels in FIG. 2 are simplified to a single channel by using the characteristic of different PN code sequences with trivial correlation.

Theory of Sliding Correlator

A programmable PN code generator with adjustable cycle period is used as signal source, shown in FIG. 2, where the chip rate is determined by the frequency of the input. Assuming the period M ($M=2^N-1$) bits, the chip rate fo (fo=1/To), the PN Code Generator can be expressed by:

$$S(t) = \sum_{j \to -\infty}^{\infty} C(t - j \cdot M \cdot To) \quad C(t) = \sum_{i=0}^{M-1} a_i \cdot g(t - i \cdot To)$$

In which one cycle PN code sequence is shown with $M=2^N-1$ and g(t)=rect (t/To).

Similar Programmable PN Code Generator (201) is used as a receiver except for different chip rate fo'=1/To'=fo(1−1/K), where K is the sliding ratio. Note that fo'→fo when K approaches infinity.

Figure 3:
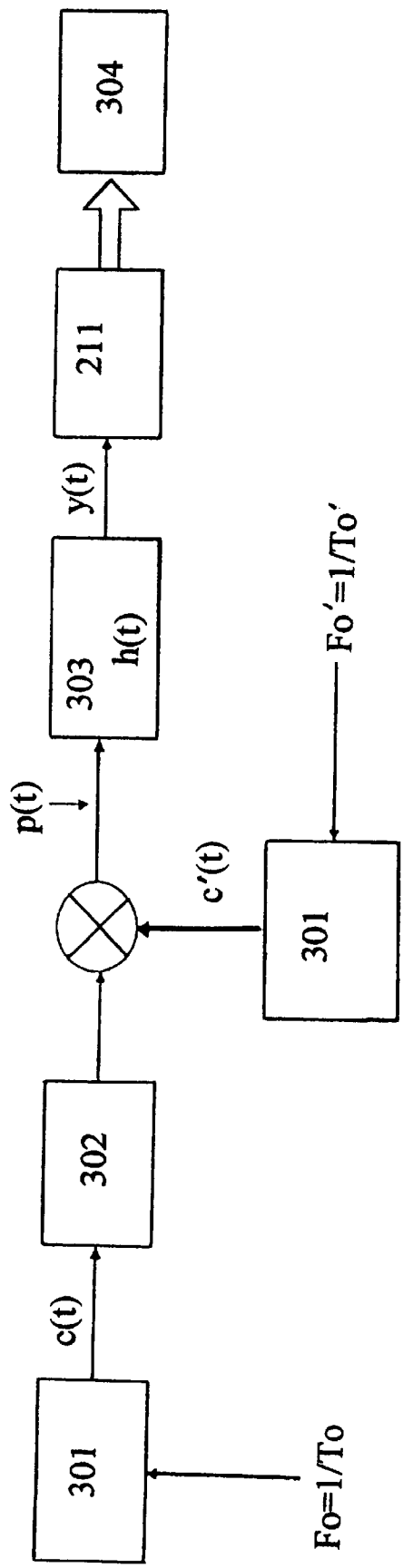
FIG. 3 illustrated Baseband model of a vector network analyzer using sliding correlator technique.

FIG. 3 shows the baseband model demonstration of the sliding correlator in a vector network analyzer. Assuming low pass filter (303) in the figure is an ideal integrator and the signal passing through the device under test to the receiver is C(t)*$^\alpha$(t) (where $^\alpha$(t) is the impulse response of the device under test), the output from the sliding correlator will be:

$$y(t) = \frac{1}{T}\int_{t-T}^{t} p(\eta)d\eta = \frac{1}{T}\int_{t-T}^{t}\left[\int_0^\infty \alpha(\xi) \cdot C(\eta - \xi)\,d\xi\right] \cdot C'(\eta)d\eta$$
$$= \int_0^\infty \alpha(\xi) \frac{1}{T}\int_{t-T}^{t} C(\eta - \xi) \cdot C'(\eta)\,d\eta \cdot d\xi$$

and the cross-correlation function of C(t)*C'(t) is $$R_{cc'}(t, \tau) = \frac{1}{T}\int_{t-T}^{t} C(\eta) \cdot C'(\eta + \tau)d\eta \text{ so } y(t) = \int_0^\infty \alpha(\xi) \cdot R_{cc'}(t, \xi)d\xi$$

After some time if fo'→fo, the cross-correlation function $R_{cc'(t,\xi)} \approx R_C(\tau)$ between the two PN code sequences. $R_C(\tau)$ is auto-correlation function when spreading on the time axis, so $$R_{cc'}(t, \xi) = R_c\left(\frac{t}{K}, \xi\right)$$

and $$y(t) = \int_0^\infty \alpha(\xi) \cdot R_c\left(\frac{t}{K}, \xi\right)d\xi.$$

If M is sufficient long, $R_C(\tau)$ can be treated like a impulse function, so $$y(t) \approx \int_0^\infty \alpha(\xi) \cdot \delta\left(\xi - \frac{t}{K}\right) = \alpha\left(\frac{t}{K}\right).$$

To summarize, the output y(t) from the sliding correlator is K times the impulse response of the device under test on the time axis. For a spreading spectrum system, the system processing gain is 10 log K.

The chip rate (fo) determines the segment bandwidth in a single measurement while the sliding ratio (K) determines the processing gain and the A/D sampling rate. Period (M) of the PN code sequence affects the frequency resolution. In the present invention, variable M is generated by a programming PN code generator.

Figure 4:
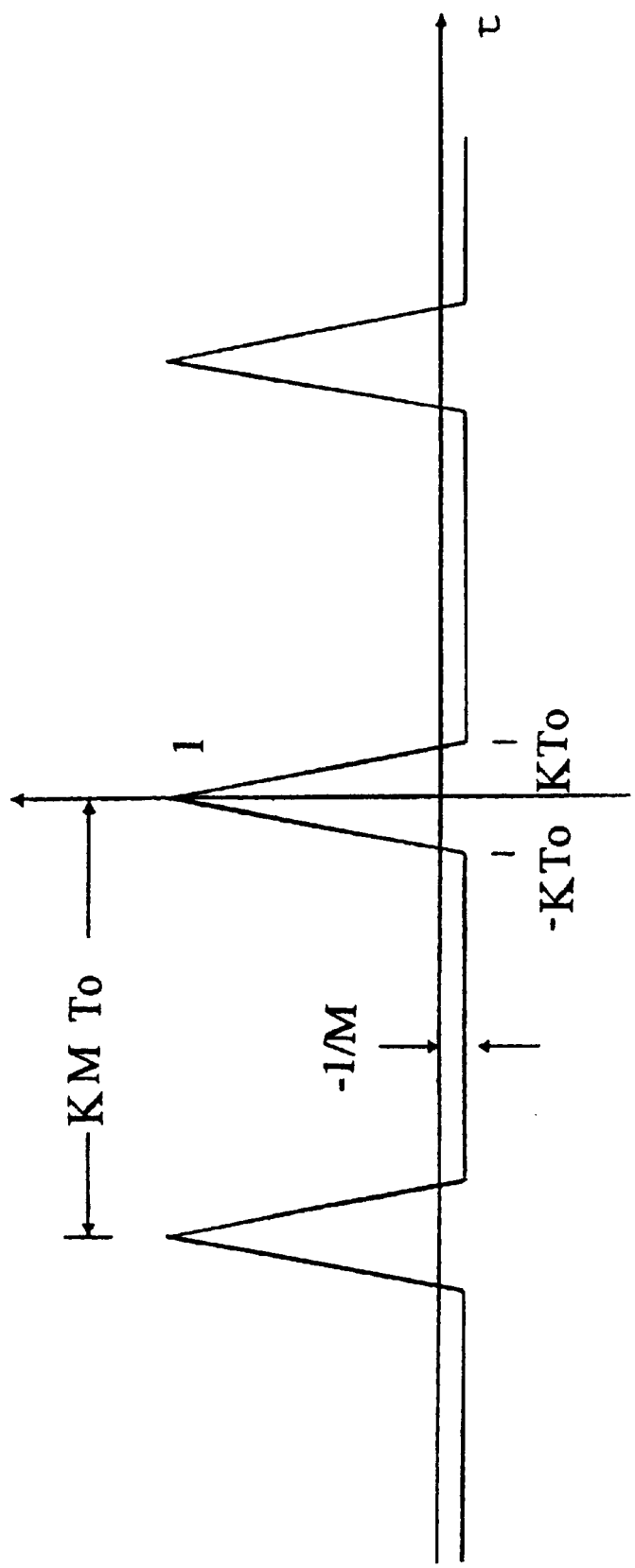
FIG. 4 illustrated Output y(t) of the sliding correlator.

FIG. 4 shows the output waveform of the sliding correlator before the device under test is connected. It can be observed that the period of the triangular pulse is K times the period $MT_0$ of the PN code sequence. When M is large, the triangular pulse can be treated as a impulse function $\delta(t)$.

After the impulse response y(t) from the device under test is obtained, fast Fourier transform is performed to get the frequency response of the device under test.

If the measured frequency is in microwave band, the PN code sequence is mixed with the microwave frequency and is up-converted to the required frequency band before feeding the device under test. In the receiving process, the received signal is down-converted to intermediate frequency (IF) and is mixed with the PN code sequence generated by the sliding correlator. Impulse response of the device under test is obtained after the IF signal is demodulated by IQ demodulator (215). An alternative way sends the signal into IQ demodulator (215) directly to demodulated the IF signal and mixes the I channel and the Q channel to obtain the impulse response.

Therefore, frequency response with bandwidth fb can be obtained in a single measurement.

DESCRIPTION OF THE CIRCUIT DESIGN

FIG. 2 shows the circuit of the vector network analyzer using a sliding correlator, comprising the signal source, the receiver, and the digital signal processing software.

(a) The Signal Source

The signal source block comprises a programmable PN code generator, synthesizers, and a modulator. The programmable PN code generator controls the chip rate of the output PN code sequence by the input frequency from the synthesizer (203). The output PN code sequence is then modulated by a high frequency synthesizer (204) to the desired frequency. The programmable PN code generator, the PN code generator's synthesizer, and the high frequency synthesizer use the same 10 MHz signal source in order to synchronize with one another.

(b) The Receiver

The transmitted signal first passes the RF switch, the bridge, and the device under test. Then a mixer down-converts the transmitted signal to IF with another high frequency signal. The IF signal is then amplified, filtered, and multiplied (despreaded) with another PN code sequence with $$\left(1 - \frac{1}{k}\right)$$

times the chip rate, which is generated by a different programmable PN code generator. Finally, the signal is sent to IQ demodulator (215) so that signals in both the I channel and the Q channel are down-converted from IF to the baseband. These two signals then pass a low pass filter, an amplifier, and a computer for signal processing. A double IF frequency is necessary to the IQ demodulator in order to produce sine and cosine waves locally.

The signal sources mentioned above, including the high frequency signal sources of the receiver, the signal sources of the programmable PN code generator, and the double IF signal sources of the IQ demodulator, are synchronized by the 10 MHz output from a synthesizer.

The reference channel uses one modulated programmable PN code. The signal is sent directly to the receiver and is demodulated by a simple channel. The output is used to trigger the A/D conversion.

(c) The Digital Signal Processing Software

The final outputs from the I and Q channels are sampled by the data acquisition board from National Instrument. The present invention also uses LabView software from Nation Instrument to control sampling rate and to perform digital signal processing. The software can carry out fast Fourier transform and display the frequency response.

FIG. 2 shows the circuit of the vector network analyzer using a sliding correlator, comprising the signal source, the receiver, and the digital signal processing software.

The Signal Source Portion is Shown in FIG. 2(a)

A incorporated programmable PN code generator can be controlled by the user to generate the period of the PN code sequence for the desired measurement. Chip rate ($f_b$) of the output PN code sequence is provided by a variable frequency synthesizer (output frequency=$f_b$). This chip rate decides the bandwidth of each measurement. The output PN code sequence is then modulated to the desired frequency band by a radio frequency synthesizer (output frequency=$f_c$) and a mixer. After measurement has been done in this band, the radio frequency synthesizer then jumps to the next desired band and carries out another measurement. The hopping interval is the same as the bandwidth in each individual measurement. The variable frequency synthesizer ($f_b$) and the radio frequency synthesizer ($f_c$) reference the same signal source ($f_0$) in order to synchronize with each other.

The Receiver Portion is Shown in FIG. 2(b)

A RF switch and bridges are included. The transmitted signal is down-converted by a synthesizer with frequency $f_c+f_{if}$ to the desired intermediate frequency(IF) of the local signal source. In FIG. 2, there's only one IF frequency introduced; however, if one is considering the removal of image frequency or other factors, two different intermediate frequencies can be incorporated in the present invention to increase the demodulated signal quality. Another programmable PN code generator which is similar to the one in FIG. 2(a) is used as the source of sliding correlators both in the testing and reference channels, such as the low pass filter (214) and the multiplier in FIG. 2. All the signal sources in the receiver portion are also synchronized to the same reference $f_0$.

The digital signal processing portion: fast Fourier transformation is carried out, then the result after A/D sampling is converted from time domain to frequency domain.

DESCRIPTION OF MEASURING METHOD

Figure 5:
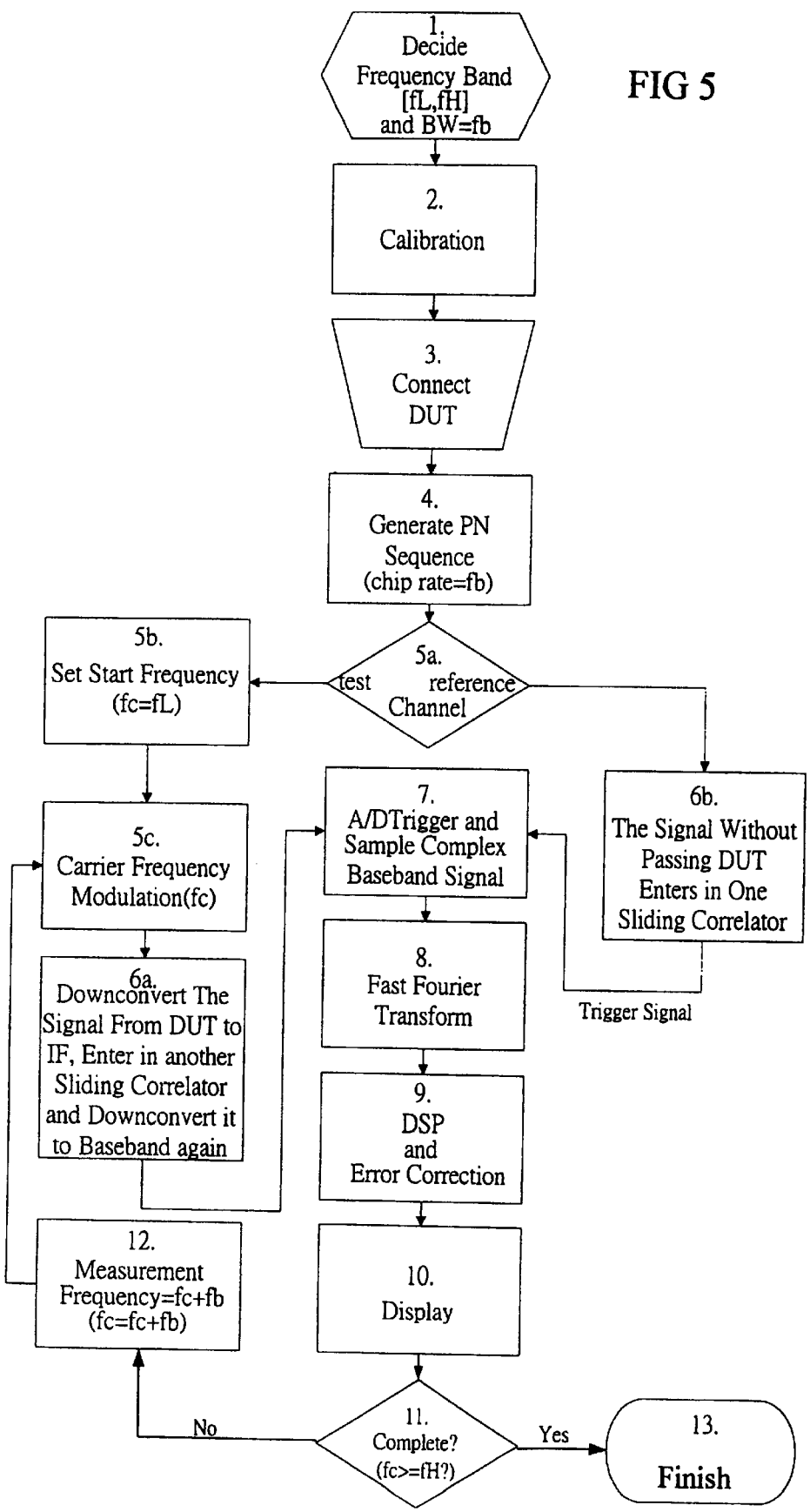
FIG. 5 illustrated Flow charts of network measurement for the vector network analyzer employed sliding correlator technique.

The Measuring method for the present invention is as followed, as shown in FIG. 5:

1. Decide the desired bandwidth (fL, fH) and the bandwidth (fb) of each measurement.
2. Calibrate the analyzer with standards (calibration kits) to obtain the parameters of error model.
3. Connect the analyzer to the two-port device under test
4. Generate PN code sequence with chip rate fb to perform measurements.
5. a) Divide the PN code sequence for the test channel and the reference channel by a splitter. The reference signal bypasses the device under test and reaches a sliding correlator in base frequency.
   b) Set the starting frequency fc to fL.
   c) Modulate the testing signal with carrier (frequency=fb) and feed the device under test.
6. a) Mix the testing signal with the PN code sequence by the sliding correlator and down-convert to complex baseband in order to generate impulse response from the device under test.
   b) Generate sampling signal with the reference signal by the mixer and the sliding correlator and feed the sampling signal into A/D Convertor as the trigger signal.
7. Trigger A/D process and sample the impulse response in the complex baseband.
8. Transform the impulse response from time domain to frequency domain by fast Fourier transform so that frequency response of the device under test is obtained.
9. Perform digital signal process and correct the measuring error.
10. Display the frequency response with bandwidth fb after error correction.
11. Check if measurements are done in all the segments. If yes, go to step 13; if no, go to step 12.
12. Increase the testing frequency with fb and go back to step 5c.
13. Finish the measurements.

To summarize, the vector network analyzer can either use two testing channels to obtain both the reflection and transmission characteristics at the same time or use one channel and one RF switch between the reflection and the transmission path. In the vector network analyzer architecture in FIG. 2, only one testing channel is shown due to the RF switch.

In order to further explain how the system works, graphic programming software such as LabView by National Instruments is used for signal processing in the present invention, shown in the top right block of FIG. 2. After processed by LabView, outcome from the network analyzer can be displayed on the computer monitor.

What is claimed is:

1. A vector network analyzer for high frequency and microwave device measurements comprising:

(a) signal source: a programmable PN code generator which generates a source signal, wherein the programmable PN code generator can generate PN code sequences for measurement by a user-controlled mechanism; wherein correlation between different PN code sequences is low;

(b) receiver: an RF switch and bridge to control the signal direction and an RF Synthesizer which can down-convert the source signal to an IF frequency required by the signal source, wherein a single channel is used to demodulate signals from different users in order to reduce an unbalanced problem between channels using a multi-user technique;

(c) digital signal processor: a Fast Fourier Transformer which transforms a resulting signal from time domain to frequency domain.

2. A vector network analyzer utilizing a sliding correlation technique and a multi-user detection technique, the vector network analyzer comprising:

a spread spectrum signal source module configured to generate a spread spectrum reference signal and a spread spectrum test signal;

a receiver module configured to receive the spread spectrum test signal through a test device to produce a spread spectrum test signal, wherein the spread spectrum test signal is combined with the spread spectrum reference signal to produce a spread spectrum combined signal and a single channel is used to demodulate signals in order to reduce an unbalanced problem between channels; and a processing module configured to convert the time domain despreaded reference signal and the time domain despreaded test signal from a time domain to a frequency domain.

3. A vector network analyzer as defined in claim 2, wherein the spread spectrum signal source module further includes two programmable pseudo random noise code sequence generators and corresponding clock signal sources, radio frequency synthesizers, and a synchronization source.

4. A vector network analyzer as defined in claim 2, wherein the receiver module further includes a signal mixer, intermediate frequency amplifiers, analog to digital converters, dispreading devices and an I/Q channel demodulator.

5. A vector network analyzer as defined in claim 2, wherein the spread spectrum reference signal and the spread spectrum test signal are two uncorrelated pseudo random noise code signals.

6. A vector network analyzer as defined in claim 2, wherein the spread spectrum test signal through a test device is electrically affected by the characteristics of the test device.

7. A vector network analyzer as defined in claim 2, wherein the processing module further comprises further comprises a Fast Fourier Transform module configured to convert the resulting signal from the time domain to the frequency domain.

8. A vector network analyzer as defined in claim 2, wherein the receiver module is also configured to demodulate and despread the spread spectrum combined signal to two separated signals: the time domain despreaded reference signal and the time domain despreaded test signal in a manner such that the despreaded test signal characterizes the electrical properties of the test device based on the sliding correlation technique.

9. A vector network analyzer as defined in claim 2, wherein the processing module is also configured to perform calibration by multi-stage architecture.

10. A vector network analyzer as defined in claim 9, wherein the frequency domain despreaded test signal is calibrated by subtracting the reconstruction of the frequency domain despreaded reference signal with a known cross-correlation of two different pseudo random noise codes in a first stage block and wherein the frequency domain despreaded reference signal is calibrated by subtracting the reconstruction of the frequency domain despreaded test signal with known cross-correlation of two different pseudo random noise codes in a second stage block.

11. A vector network analyzer as defined in claim 10, wherein multiple stage blocks are used to obtain a test signal and a reference signal where a disturbance caused by multi-user PN code effects is eliminated.

12. A vector network analyzer as defined in claim 2, wherein the processing module is further configured to divide a test signal by a reference signal to get test device frequency responses and eliminate disturbances caused by the receiver chain characteristics.

13. A vector network analyzer as defined in claim 2, wherein a desired measurement frequency band is divided into N subbands, wherein a width of one subband is a chip rate Fcr pseudo random noise code such that a frequency synthesizer hops N times with bandwidth Fcr per hop to measure a desired frequency band.

* * * * *

UNITED STATES PATENT AND TRADEMARK OFFICE
CERTIFICATE OF CORRECTION

PATENT NO. : 6,549,862 B1
DATED : April 15, 2003
INVENTOR(S) : Huang et al.

It is certified that error appears in the above-identified patent and that said Letters Patent is hereby corrected as shown below:

<u>Title page,</u>
Item [73], Assignee, "Taipei (CN)" should be -- Taipei (TW) --

Signed and Sealed this

Seventh Day of September, 2004

JON W. DUDAS
*Director of the United States Patent and Trademark Office*